United States Patent [19]
Owen

[11] 4,194,164
[45] Mar. 18, 1980

[54] VARIABLE FREQUENCY SOURCES

[75] Inventor: David P. Owen, Dunstable, England

[73] Assignee: Marconi Instruments Limited, Chelmsford, England

[21] Appl. No.: 958,431

[22] Filed: Nov. 7, 1978

[30] Foreign Application Priority Data

Nov. 24, 1977 [GB] United Kingdom .............. 49035/77

[51] Int. Cl.² .............................................. H03G 3/20
[52] U.S. Cl. ................................. 330/130; 330/134; 330/137
[58] Field of Search ............... 330/129, 130, 134, 137, 330/279; 325/144; 328/173

[56] References Cited
U.S. PATENT DOCUMENTS
3,828,270  8/1974  Ebisch .......................... 330/137 X

*Primary Examiner*—James B. Mullins
*Attorney, Agent, or Firm*—Diller, Ramik & Wight

[57] ABSTRACT

An R.F. signal generator is arranged to provide an output signal having a controlled level, by means of a feedback loop into which an additional frequency dependent control signal is injected. This additional control signal is derived from a resistor network in which particular resistors, or combinations thereof, are selected in dependence on the output frequency of the signal generator.

6 Claims, 1 Drawing Figure

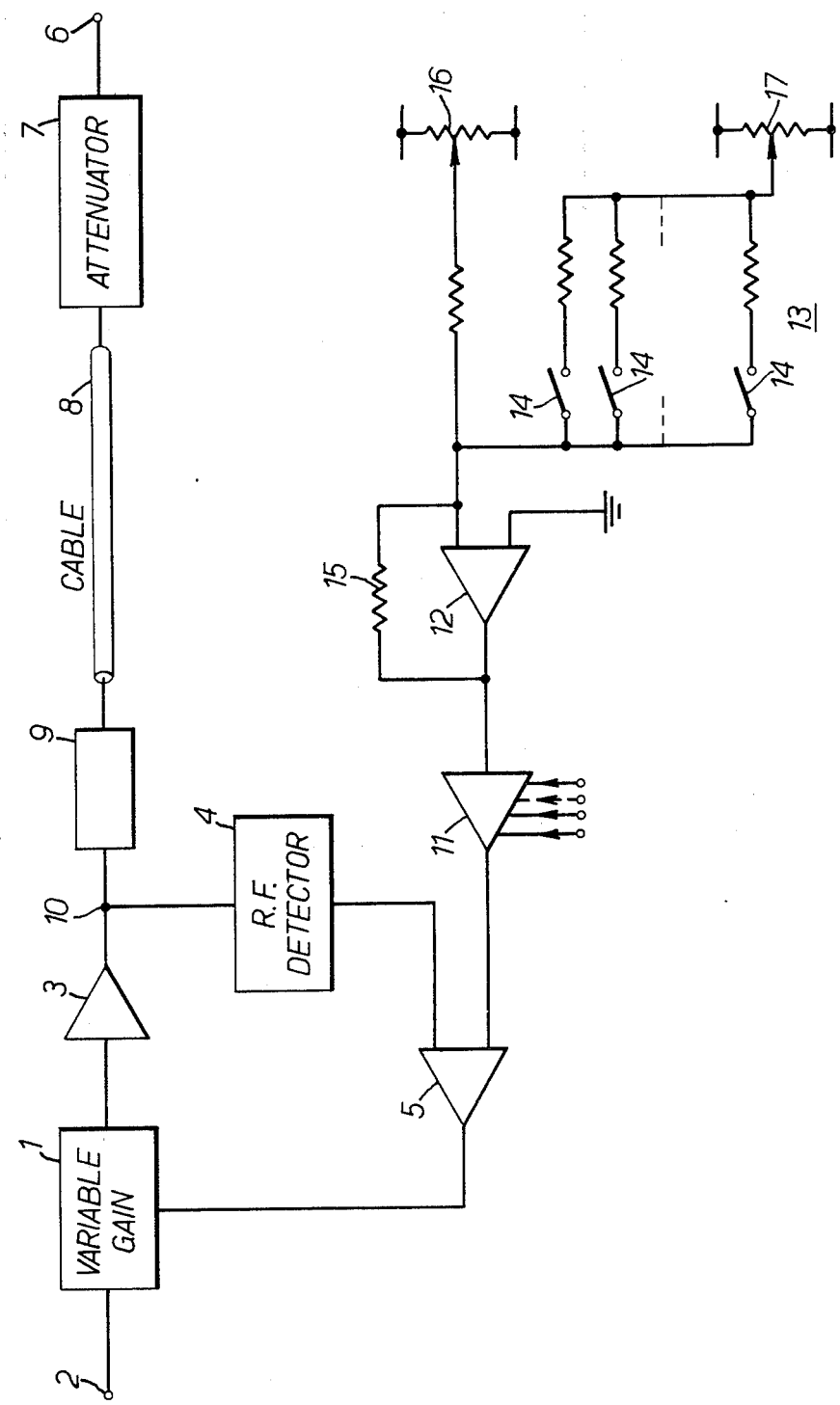

VARIABLE FREQUENCY SOURCES

This invention relates to variable frequency sources and is particularly concerned with the amplitude of a signal provided by such a source.

Variable frequency sources, such as R.F. frequency generators, include output attenuators and connecting cables associated therewith having impedances which include reactive components. The effect of this is that the power loss in the output attenuators and the connecting cables is not constant but rises with increasing frequency. It is known to include a variable gain stage which is controlled by an R.F. detector having a predetermined reactive impedance so that greater gain (or less attenuation, as the case may be) is provided in an attempt to compensate for the variation of output power level with frequency. Such expedients are, often, not sufficiently accurate and the use of R.F. detectors whose impedance varies with frequency introduces additional difficulties. The present invention seeks to provide an improved variable frequency source in which the output level is substantially constant as the frequency varies.

According to the invention, a variable frequency source includes a variable gain stage for receiving a variable frequency R.F. signal and for controlling the amplitude of the R.F. signal in dependence on its frequency by means of a control signal derived from a resistor network, the value of the control signal being at least partly dependent of the selection of particular resistors in the network which are selected as a function of the frequency of the variable R.F. signal.

Preferably, the variable gain stage forms part of a feedback loop which includes an R.F. frequency detector, said control signal also being partly dependent on the output provided by the R.F. frequency detector.

Preferably again, the feedback loop includes, in addition to the variable gain stage for receiving a variable frequency R.F. signal, an R.F. detector and a dual input comparator, one input of which is obtained from the R.F. detector and the other input of which is derived from the said resistor network, the output of the comparator being used to control said variable gain stage.

The output of the variable signal source is, preferably, taken off from a point in the feedback loop immediately preceding the R.F. detector and is fed via a length of coaxial cable to an attenuator.

Preferably, there is provided an adjustable gain amplifier between said resistor network and said other input of the comparator so as to enable fine level adjustment to be achieved.

Preferably, the resistors in the resistor network are selected in dependence on the most significant digits determining the frequency output of the variable frequency source. In all variable frequency sources, some form of frequency selection must be provided and where the selection is accomplished by means of digital keys, preferably the selection of the resistors is coupled to the operation of keys identifying the most significant digits of the output frequency value.

The invention is further described, by way of example, with reference to the accompanying drawing which illustrates, diagrammatically, the output stages of a variable frequency source.

A variable frequency R.F. signal which may be modulated as required is applied to a variable gain stage 1 via a terminal 2. The variable gain stage 1 may consist of a variable attenuator or, alternatively, a variable gain amplifier. The output of the variable gain stage 1 is passed via a fixed gain amplifier 3 to an R.F. detector 4 consisting of a high frequency Schottky barrier diode. A detected signal is applied to one input of a dual input comparator 5 which, in this case, consists of a high gain differential amplifier. The output of the comparator 5 constitutes a control signal which is applied to the variable gain stage 1 to complete a feedback loop and to control the gain of the variable gain stage as required. The output of the variable frequency source is obtained at a terminal 6 via coarse attenuator 7, a length of coaxial cable 8 and a source resistor 9 from a point 10 in the feedback loop immediately preceding the R.F. detector 4. The source resistor 9 has a value of 50Ω and represents the output impedance of the variable frequency source. The components 7 and 8, in particular, contain reactive impedances and their power losses rise with increasing frequency so that, if no compensation were provided, the output power level obtainable at terminal 6 would be lower at the upper end of the output frequency band than it woud be at the lower end. Even so, the feedback loop, as so far described, serves to elliminate amplitude variations occurring in the input signal applied to terminal 2.

To reduce to acceptable levels the amplitude variations in the output signal, two further amplfiers 11 and 12 and a resistor network 13 are coupled to the second input of the comparator 5. In this way, the effective reference level which is applied to the comparator 5 to determine the operating level of the feedback loop, can be altered as required and, in practice, it is arranged that it is altered in step with changes in the value of the output R.F. carrier frequency.

Typically, an R.F. frequency s ource may provide an output carrier frequency extending up to 500 MHz and it has been found sufficient to sub-divide this range into twenty-five divisions and to provide a different correction factor for each division. It will be appreciated that each division of 20 MHz can be identified from the two most significant digits of the frequency value and, as the output value of the frequency source is manually or automatically selected, so this information is also used to select appropriate switches 14. One or more switches can be selected as required and the gain of the amplifier 12 is then determined by the ratio of resistor 15 to the effective resistance of the network 13. Fine adjustment can be provided when setting up the circuit by means of adjustable potentiometers 16 and 17. Two potentiometers 16 and 17 are used so that one potentiometer 16 can be used to set the approximate signal level fed to the comparator 5, and the other potentiometer 17 is used to adjust the overall degree of frequency compensation. The additional variable gain amplifier 11 can be used to introduce deliberate variations in the output level as required and it effectively functions as a fine attenuator control.

I claim:

1. A variable frequency source including a variable gain stage for receiving a variable frequency R.F. signal and for controlling the amplitude of the R.F. signal in dependence on its frequency by means of a control signal characterised in that the control signal is derived from a resistor network, the value of the control signal being at least partly dependent on the selection of particular resistors in the network which are selected as a function of the frequency of the variable R.F. signal.

2. A variable frequency source as claimed in claim 1 and wherein the variable gain stage forms part of a feedback loop which includes an R.F. frequency detector, said control signal also being partly dependent on the output provided by the R.F. frequency detector.

3. A variable frequency sources as claimed in claim 2 and wherein the feedback loop includes, in addition to the variable gain stage for receiving a variable frequency R.F. signal, an R.F. detector and a dual input comparator, one input of which is obtained from the R.F. detector and the other input of which is derived from the said resistor network, the output of the comparator being used to control said variable gain stage.

4. A variable frequency source as claimed in claim 2 or 3 and wherein the output of the variable signal source is taken off from a point in the feedback loop immediately preceding the R.F. detector and is fed via a length of coaxial cable to an attenuator.

5. A variable frequency source as claimed in claim 3 and wherein there is provided an adjustable gain amplifier between said resistor network and said other input of the comparator so as to enable fine level adjustment to be achieved.

6. A variable frequency source as claimed in claim 1 and wherein the resistors in the resistor network are selected in dependence on the most significant digits determining the frequency output of the variable frequency source.

* * * * *